(12) United States Patent
Lenz

(10) Patent No.: US 9,401,725 B2
(45) Date of Patent: Jul. 26, 2016

(54) SUPPRESSING OFFSET, OFFSET DRIFT, AND 1/F NOISE DURING ANALOG/DIGITAL CONVERSION

(71) Applicant: Helmut Lenz, Oberasbach (DE)

(72) Inventor: Helmut Lenz, Oberasbach (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/631,324

(22) Filed: Feb. 25, 2015

(65) Prior Publication Data

US 2015/0263750 A1    Sep. 17, 2015

(30) Foreign Application Priority Data

Mar. 12, 2014  (DE) .......................... 10 2014 204 518

(51) Int. Cl.
*H03M 1/06*    (2006.01)
*H03M 1/12*    (2006.01)

(52) U.S. Cl.
CPC .......... *H03M 1/0607* (2013.01); *H03M 1/0639* (2013.01); *H03M 1/12* (2013.01)

(58) Field of Classification Search
CPC .... H03M 1/0634; H03M 1/658; H03M 1/201
See application file for complete search history.

(56) References Cited

U.S. PATENT DOCUMENTS

| | | | | |
|---|---|---|---|---|
| 4,839,650 | A * | 6/1989 | Geen et al. | 341/118 |
| 4,939,516 | A * | 7/1990 | Early | 341/143 |
| 6,268,814 | B1 | 7/2001 | Kolsrud | |
| 7,362,255 | B1 * | 4/2008 | Tsyrganovich | H03M 3/34 341/155 |
| 7,825,839 | B2 * | 11/2010 | Bratfisch et al. | 341/131 |
| 7,956,778 | B2 * | 6/2011 | Koyama | 341/131 |
| 8,604,953 | B2 * | 12/2013 | Ali | 341/120 |

FOREIGN PATENT DOCUMENTS

EP         1134898 A2    9/2001
WO    WO 2009149939 A2 * 12/2009

* cited by examiner

*Primary Examiner* — Howard Williams
(74) *Attorney, Agent, or Firm* — Lempia Summerfield Katz LLC

(57) ABSTRACT

A circuit arrangement is provided for suppressing offset, offset drift, and 1/f noise during analog/digital conversion. The arrangement includes an analog/digital converter configured to convert an analog input signal into output data, an inverter configured to invert the input signal, a switching element connected upstream of the analog/digital converter and downstream of the inverter and configured to periodically change over between the input signal and the inverted input signal at a predefinable switching frequency, and a switchable negator circuit connected downstream of the analog/digital converter and configured to periodically negate the output data from the analog/digital converter at the switching frequency, the output data being negated when the inverted input signal is applied to the analog/digital converter. An analog/digital converter is also provided with suppression of offset, offset drift, and 1/f noise during analog/digital conversion. A gradient amplifier having a circuit arrangement or an analog/digital converter is also provided.

20 Claims, 11 Drawing Sheets

FIG 1
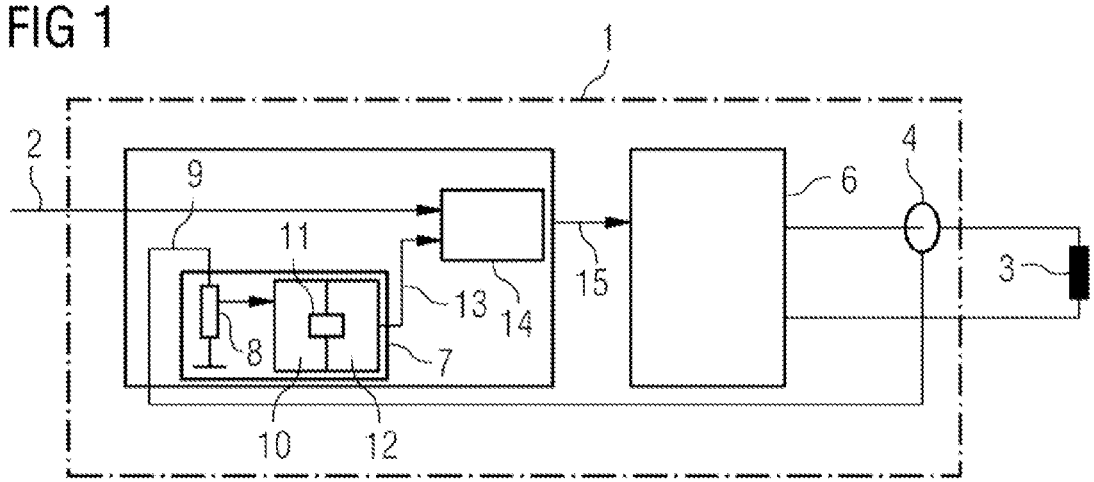
FIG 2  Prior Art
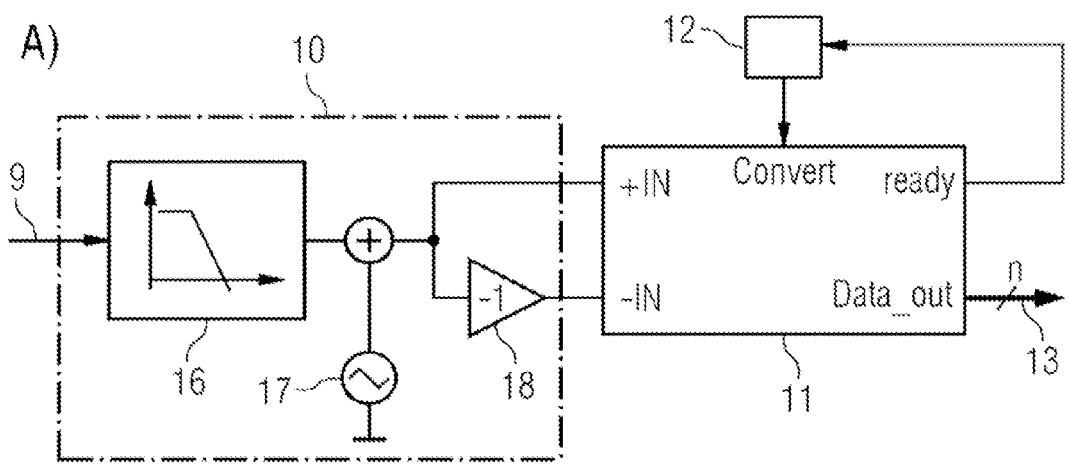
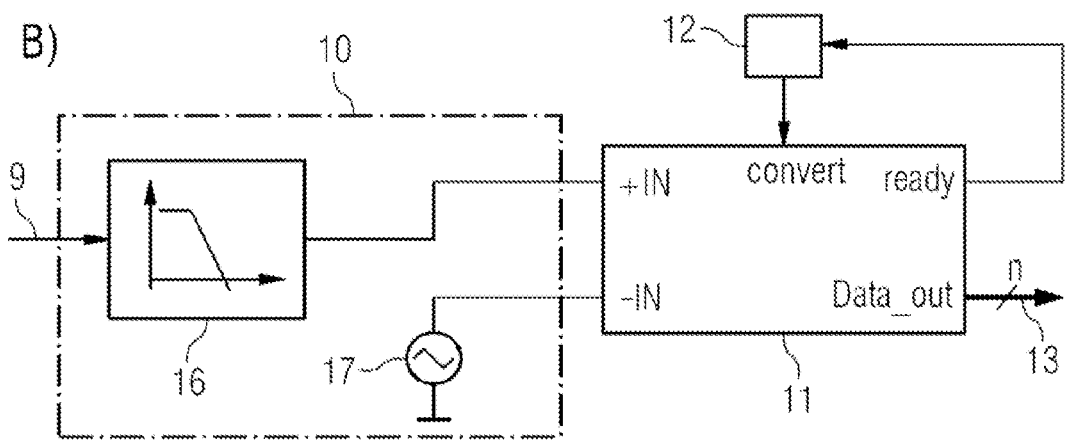

FIG 5
A)
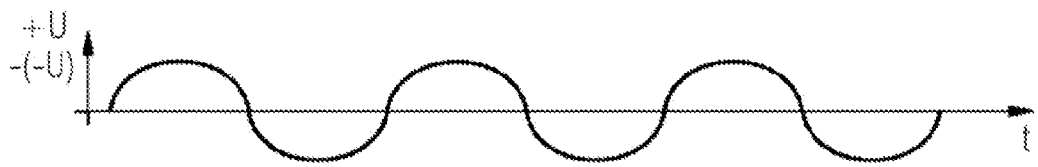
B)
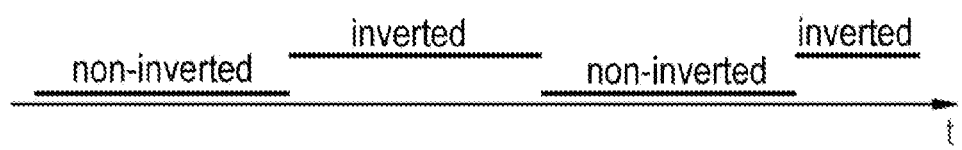
C)
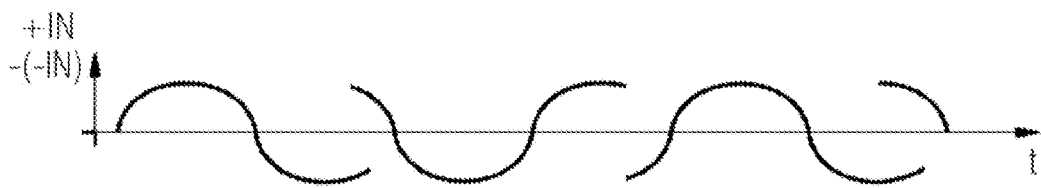
D)
E)
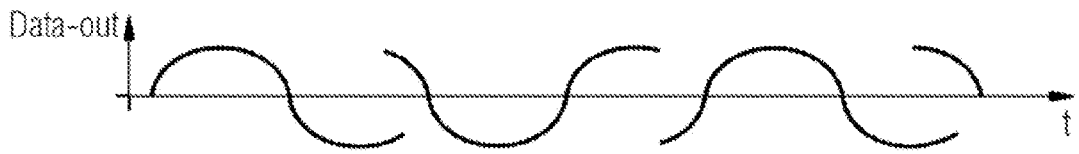
F)
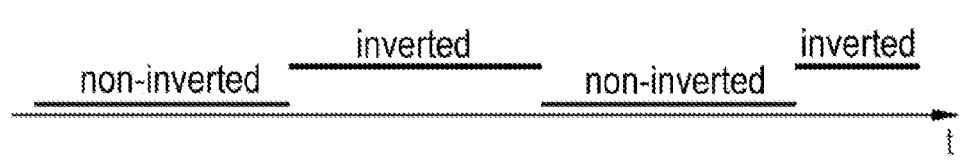
G)
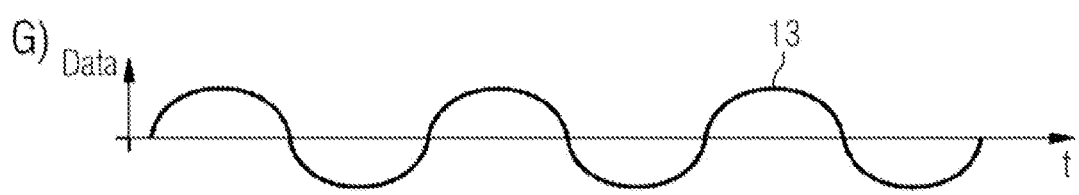

FIG 7
A)
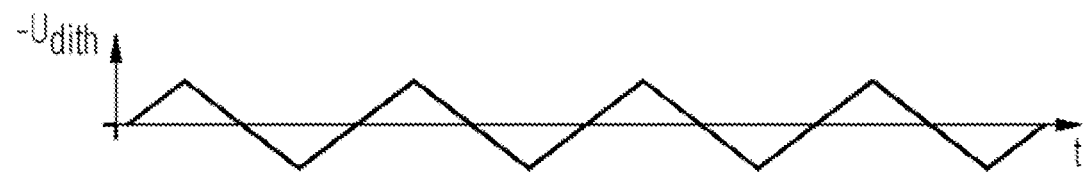
B)
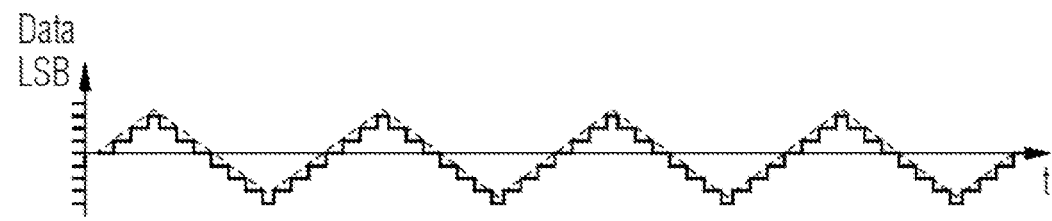
C)
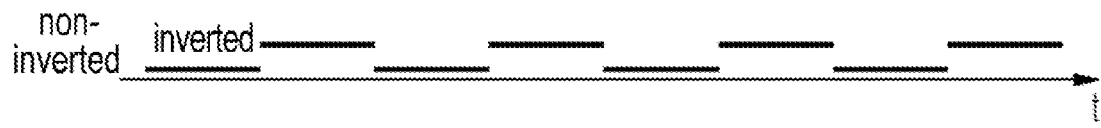
D)
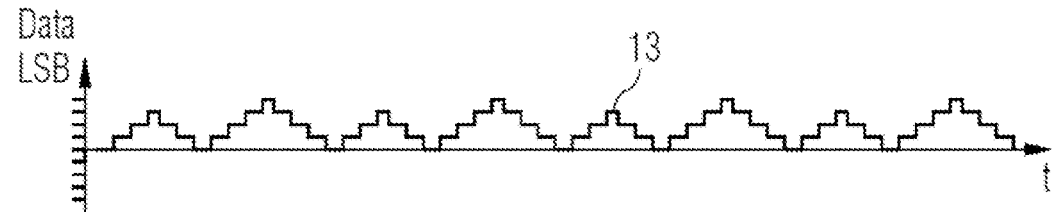

FIG 8
A)
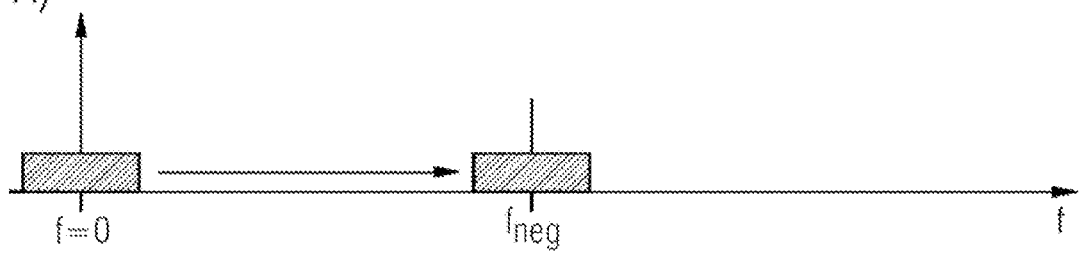
B)
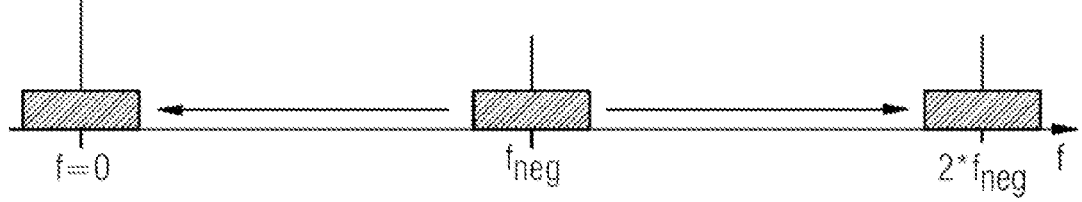
C)
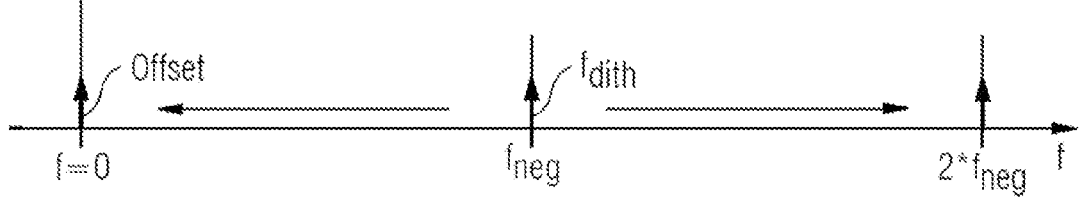

FIG 12
A)
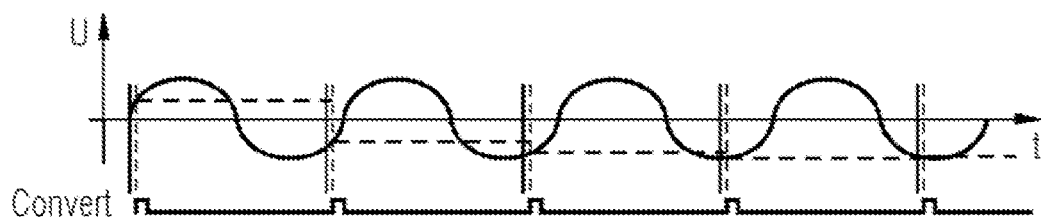
B)
C)
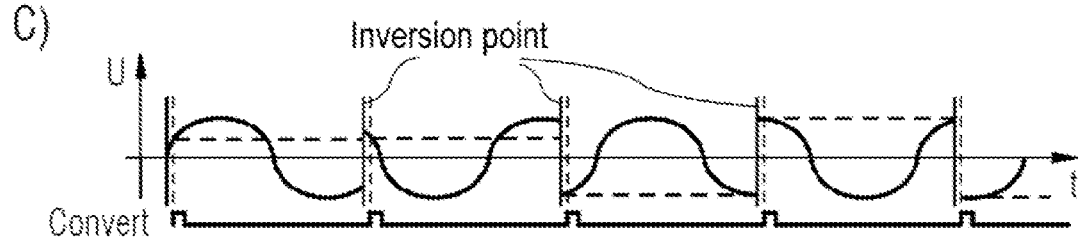
D)
E)
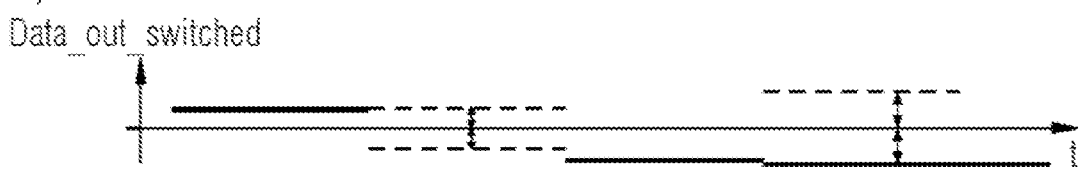

SUPPRESSING OFFSET, OFFSET DRIFT, AND 1/F NOISE DURING ANALOG/DIGITAL CONVERSION

CROSS-REFERENCE TO RELATED APPLICATIONS

This application claims the benefit of DE 10 2014 204 518.5, filed on Mar. 12, 2014, which is hereby incorporated by reference in its entirety.

TECHNICAL FIELD

The embodiments relate to a circuit arrangement for suppressing offset, offset drift, and 1/f noise during analog/digital conversion using an analog/digital converter that converts an analog input signal into output data. The embodiments also specify an analog/digital converter with suppression of offset, offset drift, and 1/f noise during analog/digital conversion. A gradient amplifier having such a circuit arrangement or such an analog/digital converter is also specified. An associated analog/digital conversion method is likewise specified.

BACKGROUND

Suppression of offset, offset drift, and 1/f noise during analog/digital conversion is needed, in particular, to digitally regulate and control gradient amplifiers in magnetic resonance imaging.

A gradient amplifier having a basic field of greater than 1 Tesla (T) and a gradient strength of greater than 30 mT/m empirically requires a current stability of less than 0.25 ppm in the frequency range of 0.1 Hz to 10 Hz, which corresponds to a ratio of 1:4,000,000. The current of gradient amplifiers for magnetic resonance tomography is therefore nowadays regulated in an analog manner and has corresponding low-noise components in its signal path.

If the current of the gradient amplifier is intended to be regulated in a digital manner, an analog/digital converter (ADC) is used. FIG. 1 depicts a block diagram of a gradient amplifier 1 for magnetic resonance tomography. The gradient amplifier 1 regulates a current in the gradient coil 3 connected to the gradient amplifier 1 according to a digital desired value 2 generated by a controller of a magnetic resonance installation.

The current is recorded by a current measuring unit 4, (for example, a very accurate DC current transformer), which feeds its secondary current to a measuring resistor 8 (e.g., shunt) that is part of the current actual value preprocessor 7. The measurement voltage 9 at the measuring resistor 8 is now a measure of the measured gradient current. The measurement voltage 9, which needs to be amplified under certain circumstances, in the measuring resistor 8, that is to say the analog current actual value, is processed by the analog actual value preprocessor 10. The measurement voltage 9 is converted, by an analog/digital converter (ADC) 11, into a digital current actual value 13 that is now present in the ADC control unit 12. The ADC control unit 12 controls the times at which the ADC 11 is intended to carry out conversion and appropriately receives the converted values from the ADC 11.

In order to regulate the gradient current, the digital current actual value 13 is compared with the desired value 2 in the regulating and drive unit 14. The regulating and drive unit 14 generates the drive signal 15 for the output stage 6 of the gradient amplifier 1, to which the gradient coil 3 is connected. The current actual value preprocessor 7 and the regulating and drive unit 14 are part of a regulating and control unit 5.

FIG. 2 depicts a block diagram of the further processing of the analog current actual value 9 in the analog actual value preprocessor 10 and the ADC 11. The analog current actual value 9 may be passed via an anti-aliasing filter 16, for example, via a low-pass filter.

Upstream of the ADC 11, a slight signal ripple (e.g., dithering, dither signal) is added by the dithering unit 17 to the current actual value filtered in this manner in order to obliterate the quantization limits of the ADC 11 for low frequencies. The voltage of the dithering unit 17 may be, for example, a triangular voltage, the peak-to-peak value of which corresponds at least to a "Least Significant Bit" (LSB) at the input of the ADC 11 and the frequency of which differs from the sampling frequency (e.g., conversion frequency) of the ADC 11.

In the block diagram A) in FIG. 2, the signal provided with dithering by the dithering unit 17 is additionally passed via an inverter 18 and is then supplied to the ADC 11 with differential inputs. It is likewise possible to supply the dithering to only one input of the ADC 11 by adding the dithering to the signal downstream of the inverter 18, for example. As a result, the ADC 11 is no longer driven in an exactly symmetrical manner; however, since the dithering has only a level of one LSB or a few LSBs, this may be tolerated.

The block diagram B) in FIG. 2 illustrates how the ADC 11 may also be driven using a so-called "single-ended" signal, in which case the inverter 18 according to block diagram A) is not required. In this case, the dithering from the dithering unit 17 is simply fed into the reference input and thus need not be added to the filtered signal.

The conversion by the ADC 11 is triggered by an ADC control unit 12 using the control signal "Convert". Before the control signal "Convert" is applied, the ADC 11 is receptive to the signal (e.g., "sample") applied to its inputs and holds this signal internally using the control signal "Convert" (e.g., "hold"). At the end of the conversion process, the new data with the bit width "n" are present at the output "Data_out" of the ADC 11 and the ADC 11 uses the output "ready" to signal the acceptance of the n bits of data from the output "Data_out" to the ADC control unit 12. At the end of the conversion process, the ADC 11 changes to the "sample" state again and connects its internal memory (e.g., a capacitor) to the inputs +IN and −IN again.

Circuit arrangements according to FIG. 2 are known. For example, the published patent application EP 1 134 898 A2 describes an ADC circuit arrangement with dithering.

The disadvantage of circuit arrangements according to FIG. 2 is that the stability required for magnetic resonance high-field systems (e.g., ≥1 Tesla) may not be achieved at low frequencies using the available ADC 11. A stability of less than 0.25 ppm is achieved in the frequency range of 0.1 Hz to 10 Hz, which corresponds to a stable resolution and accuracy of at least 22 bits. In this case, it is assumed that other components, (e.g., the current transformer 4), are ideal and do not contribute to the overall noise.

SUMMARY AND DESCRIPTION

The scope of the present invention is defined solely by the appended claims and is not affected to any degree by the statements within this summary. The present embodiments may obviate one or more of the drawbacks or limitations in the related art.

The object is to specify a circuit arrangement, an analog/digital converter, a gradient amplifier, and a method that overcome the above disadvantages and suppress offset, offset drift, and 1/f noise during analog/digital conversion.

The concept involves connecting switching elements upstream of the inputs of an ADC, to which the input signal and the inverted input signal are applied, in order to suppress offset, offset drift, and 1/f noise of the ADC. The switching elements are periodically changed over, with the result that the ADC periodically converts non-inverted and inverted signals. The output data from the ADC are passed via a switchable negator circuit. In a manner matching the inversion or non-inversion by the switching elements at the input, the output data from the ADC are negated or not negated, with the result that the original signal upstream of the switching elements is available in the output data from the switchable negator circuit.

In analog technology, an inverter reverses the polarity (e.g., inverting amplifier). In digital technology, the inverter makes "low" from "high" and vice versa. In the case of a negator in the negator circuit, it remains open whether inversion is carried out bit by bit or whether multiplication by −1 is carried out.

The embodiments provide a circuit arrangement for suppressing offset, offset drift, and 1/f noise during analog/digital conversion, including an analog/digital converter that is configured to convert an analog input signal into output data. The arrangement also includes an inverter that is configured to invert the input signal, at least one switching element that is connected upstream of the analog/digital converter and downstream of the inverter and is configured to periodically change over between the input signal and the inverted input signal at a predefinable switching frequency, and a switchable negator circuit that is connected downstream of the analog/digital converter and is configured to periodically negate the output data from the analog/digital converter at the switching frequency, the output data being negated when the inverted input signal is applied to the analog/digital converter.

The embodiments provide the advantage that the offset, the offset drift, and the 1/f noise (e.g., low-frequency noise) are suppressed during analog/digital conversion.

In one development, the switching frequency is at most half as high as a conversion frequency of the analog/digital converter.

In another embodiment, the circuit arrangement includes an analog/digital control unit that is configured to control the switching element and the switchable negator circuit.

In another embodiment, the circuit arrangement includes two switching elements, wherein one switching element is connected upstream of a positive input and the other switching element is connected upstream of a negative input of the analog/digital converter.

In another refinement, the circuit arrangement includes a switching element that is connected upstream of a positive input of the analog/digital converter, and a reference ground (or ground) that is connected to a negative input of the analog/digital converter.

The circuit arrangement also includes a dithering unit that is connected upstream of the inverter and is configured to apply dithering (e.g., dither signal) to the input signal and the inverted input signal.

In another embodiment, the circuit arrangement includes a switching element that is connected upstream of a positive input of the analog/digital converter, and a dithering unit that is connected to a negative input of the analog/digital converter.

In another embodiment, the switchable negator circuit includes a negator and a polarity selection switch that is connected downstream of the negator.

In another refinement, the negator may be configured to multiply the output data by "−1".

In another refinement, the negator may be configured to invert the bits of the output data.

The circuit arrangement may also include an anti-aliasing filter that is arranged at the input of the circuit arrangement and is configured to filter the input signal.

In another embodiment, the circuit arrangement includes a voltage follower that is connected downstream of the switching element.

The embodiments also provide an analog/digital converter with suppression of offset, offset drift, and 1/f noise during analog/digital conversion, wherein the analog/digital converter is configured to convert an analog input signal into output data. The analog/digital converter includes an inverter that is configured to invert the input signal, two switching elements that are connected upstream of the analog/digital conversion and downstream of the inverter and are configured to periodically change over between the input signal and the inverted input signal at a predefinable switching frequency, and a switchable negator circuit that is connected downstream of the analog/digital conversion and is configured to periodically negate the output data from the analog/digital conversion at the switching frequency, the output data being negated when the inverted input signal is applied.

The embodiments provide the advantage that the functions may be implemented in a single component.

The embodiments also provide an analog/digital converter with suppression of offset, offset drift, and 1/f noise during analog/digital conversion, which is configured to convert an analog positive input signal and a negative input signal into output data, having two switching elements that are connected upstream of the analog/digital conversion and are configured to periodically change over between the positive input signal and the negative input signal at a predefinable switching frequency, and having a switchable negator circuit that is connected downstream of the analog/digital conversion and is configured to periodically negate the output data from the analog/digital conversion at the switching frequency.

In one development, the analog/digital converter includes a voltage follower that is connected downstream of the switching element.

The embodiments also provide a gradient amplifier having a circuit arrangement according to the invention or having an analog/digital converter according to the invention, wherein the input signal is a current actual value of a gradient coil recorded using a measuring resistor.

The embodiments also provide a method for suppressing offset, offset drift, and 1/f noise during analog/digital conversion of an analog input signal to output data, with inversion of the input signal, with periodic changing over between the input signal and the inverted input signal at a predefinable switching frequency before the analog/digital conversion and after the inversion, and with periodic negation of the output data at the switching frequency after the analog/digital conversion, the output data being negated in the case of an inverted input signal.

BRIEF DESCRIPTION OF THE DRAWINGS

FIG. 1 depicts an embodiment of a block diagram of a gradient amplifier.

FIG. 2 depicts an embodiment of two block diagrams of the analog actual value preprocessor and of the ADC.

FIG. 5 depicts an embodiment of graphs of the signals from an ADC.

FIG. 7 depicts an embodiment of graphs of the influence of dithering.

FIG. 8 depicts an embodiment of graphs of the spectrum shifts.

FIG. 12 depicts an embodiment of graphs of the signals from an ADC without an anti-aliasing filter.

DETAILED DESCRIPTION

Figure 3:
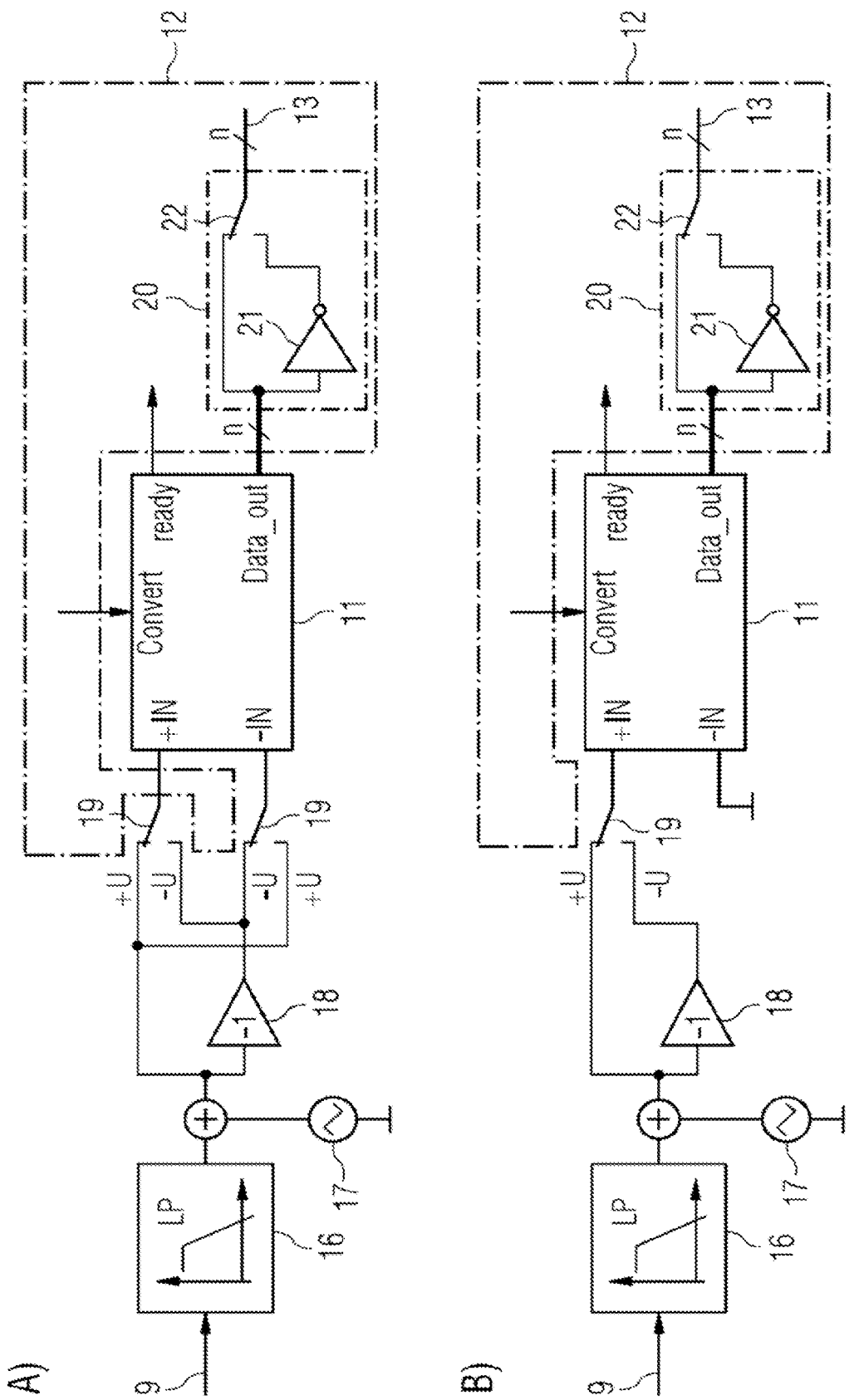
FIG. 3 depicts an embodiment of two block diagrams of the analog actual value preprocessor and of the ADC with suppression of the offset and of the 1/f noise.

FIG. 3 depicts two block diagrams of the circuit arrangement. The block diagram A) depicts the control of the ADC 11 with differential inputs according to the block diagram A) in FIG. 2. Two electronic switching elements 19, which, like the ADC 11, are controlled by the ADC control unit 12, are arranged in the analog section of the circuit arrangement. In addition, there is also the switchable negator circuit 20 at the output of the ADC 11, which negator circuit is likewise switched by the ADC control unit 12. The negator circuit 20 may be part of the ADC control unit 12.

The switching elements 19 are switched at the same time and apply either the filtered signal with dithering in the polarity as in FIG. 2 or else with reverse polarity to the inputs +IN and −IN of the ADC 11. The switchable negator circuit 20 is used to accept the output data either with the polarity as in FIG. 2 or else with "reverse polarity" when the conversion result comes from conversion of the input signal with inputs whose polarity has been reversed by the switching elements 19.

The block diagram B) in FIG. 3 depicts a circuit arrangement for an ADC 11 having a "single-ended" input corresponding to the block diagram B) in FIG. 2. In contrast to FIG. 2, the dithering is added to the filtered current actual value here. In contrast to the block diagram A) in FIG. 3, only a single switching element 19 is required here.

Figure 4:
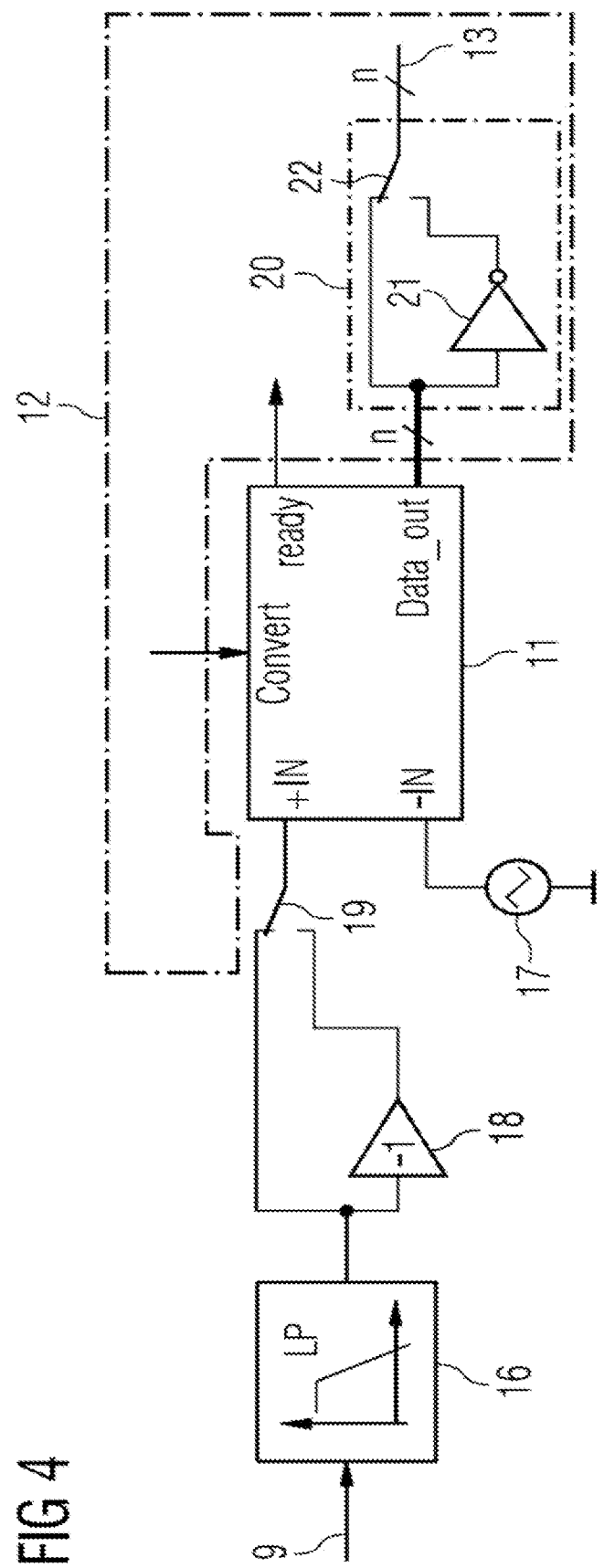
FIG. 4 depicts another embodiment of a block diagram of the analog actual value preprocessor and of the ADC with suppression of the offset and of the 1/f noise.

FIG. 4 depicts an alternative for controlling an ADC 11 having a "single-ended" input according to block diagram B) in FIG. 3. In contrast to the block diagram B) in FIG. 3, the dithering is supplied to the reference pin of the ADC 11, as in FIG. 2.

The circuit arrangements according to FIG. 3 and FIG. 4 have the following extended function in comparison with the circuit arrangements from FIG. 2: depending on the switching state of the switching elements 19, the original signal or the original signal whose polarity has been reversed is supplied to the ADC 11. Like the circuit arrangements in FIG. 2, the ADC accordingly uses its input signal to generate data that correspond to the original signal or else are data with a reverse polarity. The ADC control unit 12 may convert the data with a reverse polarity into data with the original polarity again using the negator circuit 20.

FIG. 5 depicts graphs of the function of the circuit arrangements from FIG. 3 and FIG. 4 on the basis of time t. The graph A) depicts the signal +U or −(−U) applied to the switching element(s) 19. The signal +U or −U is so large that it is not possible to discern dithering. Graph B) depicts the changeover signal for the switching element(s) 19. Whenever this signal has the level "high", the signal to the ADC input is inverted (graph C)). In comparison with the illustrated frequency of the original signal and in comparison with the frequency at which the switching elements 19 are changed over, the frequency of "Convert" is very high (graph D)).

Graph E) depicts the data output Data_out of the ADC 11. An image of the signal from the ADC input is now present in numerical form. In a manner matching the control of the switching elements 19 (graph B)), the ADC data Data_out have their polarity reversed or are accepted without change by the switchable negator circuit 20 (graph F)), with the result that a data signal corresponding to the original signal (graph A)) is again present as a digital current actual value 13, as illustrated in graph G).

Figure 6:
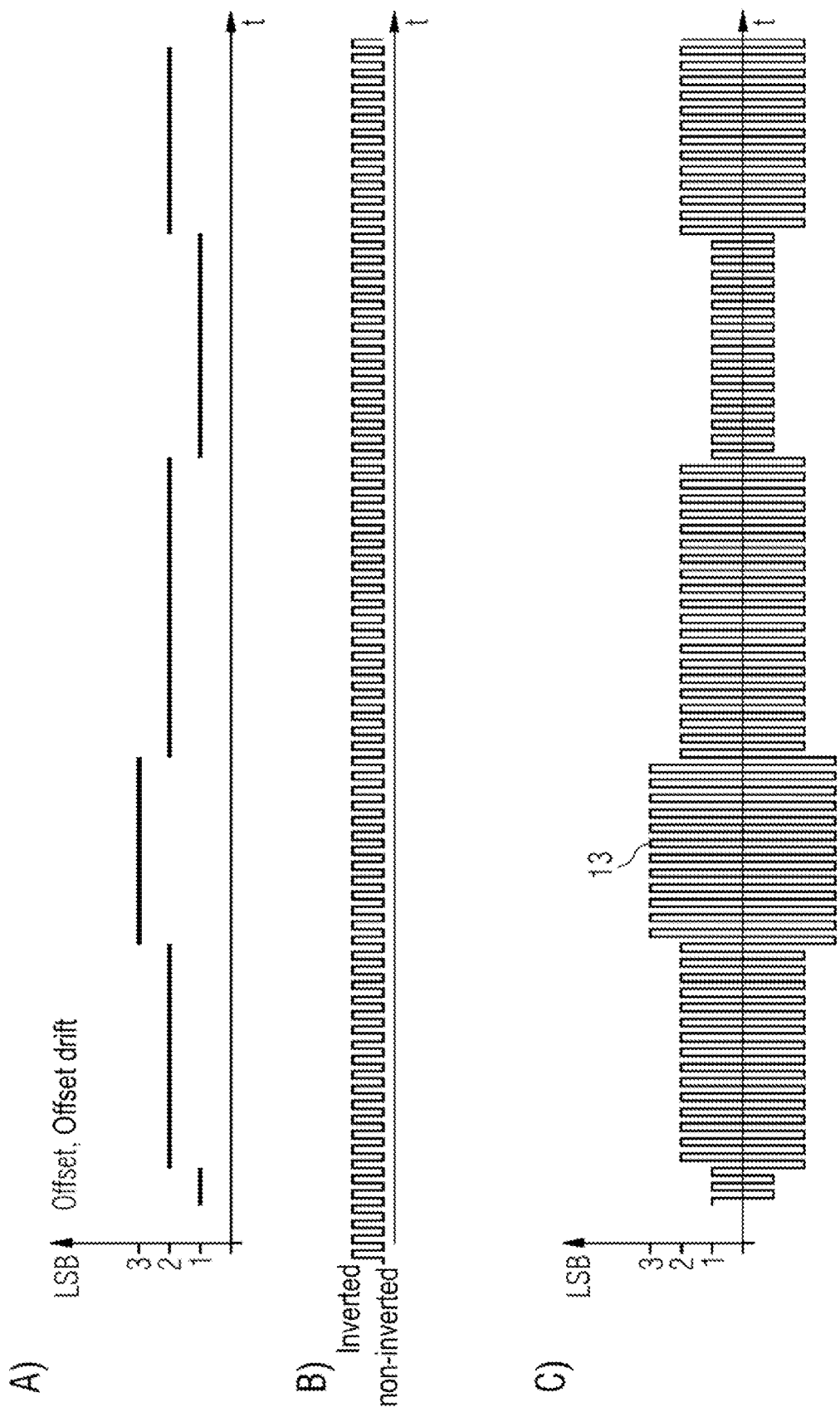
FIG. 6 depicts an embodiment of a graph of the digital current actual value.

The advantage of a circuit arrangement is provided in FIG. 6. FIG. 6 depicts graphs of signal profiles on the basis of time t. The signals +U and −U upstream of the switching element(s) 19 are zero and are therefore not illustrated. The signal downstream of the switching elements 19, that is to say at the input of the ADC 11, is therefore also zero (regardless of whether it is inverted or not inverted) and is therefore not illustrated.

It is assumed that the ADC 11 has an offset and a low-frequency offset drift and low-frequency 1/f noise. The data Data_out converted by the ADC 11 (e.g., at high frequency, cf. FIG. 5 in this respect) reflect this offset and this noise (graph A)). The data from Data_out are now periodically negated or not negated (graph B)) by the switchable negator circuit 20 at a frequency that is substantially higher than the frequency of the noise but lower than the conversion frequency $f_{ADC}$ of the ADC 11.

The result is illustrated in graph C) in FIG. 6. An oscillation at the fundamental frequency of the switchable negator circuit 20 is produced, the amplitude envelope of which is the same as the profile of the magnitude of the offset and of the offset drift of the ADC. The DC voltage offset and its drift and low-frequency noise are therefore converted into a high-frequency alternating signal without offset and without a substantial low-frequency signal component.

The magnetic resonance imaging is more insensitive to an interference frequency in the gradient current, the higher this frequency. The regulation of the gradient amplifier also has a low-pass character, with the result that high-frequency interference in the actual value may be found in the gradient current only in attenuated form anyway. It may be concluded from this that interfering low-frequency noise components of the ADC 11 that have an imaging effect for magnetic resonance imaging are therefore completely converted into a signal that does not have an imaging effect.

In FIG. 6, positive and negative data components alternate within a switching period of the switchable negator circuit 20 downstream of the switchable negator circuit 20. The data stream therefore begins with +1 LSB/−1 LSB/+1 LSB/−1 LSB. However, a period is then not compensated for: +1 LSB/−2 LSB. The following periods are compensated for again, +2 LSB/−2 LSB, etc. When the noise signal from the ADC 11 changes, periods that are not compensated for, that is to say temporally limited deviations from the symmetrical state, that is to say ultimately remains of the noise, are therefore produced. In this case, the signal/time area is determined by the deviation and the period duration.

In order to keep the remains of the noise low, only the period duration may be shortened since the minimal signal level is given by 1 LSB and may not be changed. Shortening the period duration of a switching cycle of the switchable negator circuit 20 corresponds to an increase in its frequency. It follows from this that the circuit arrangements according to FIG. 3 and FIG. 4 operate better, the higher the switching frequency $f_{neg}$ of the switching elements 19. At most, the switching frequency $f_{neg}$ may be half the ADC conversion frequency $f_{ADC}$.

The following may apply to the switching frequency $f_{neg}$ of the switching elements 19 and the switchable negator circuit 20:

$$f_{ADC} = (2m) * f_{neg} \qquad (1),$$

where m=a positive integer (e.g., 1, 2, 3, etc.)

FIG. 5 illustrates how a signal is changed to its original form again after the periodic polarity change by the switching elements 19, conversion by the ADC 11 and a polarity change matching the switching elements 19 in the switchable negator circuit 20, but the signal is now present as a numerical data stream.

FIG. 7 depicts the influence of dithering of a circuit arrangement according to FIG. 4 in the form of graphs. Assuming that the original signal upstream of the switching element 19 is zero in FIG. 4, the signal will also still be zero downstream of the switching element 19. The input signal is therefore not illustrated in FIG. 7.

Dithering in the form of a triangular voltage $U_{dith}$ with the amplitude of a plurality of LSBs is fed in at the reference pin, which dithering has the frequency $f_{neg}$ of the negator circuit 20 (graph A). In graph A) in FIG. 7, the axis is marked with $-U_{dith}$ since the dithering is fed in at the inverted input according to FIG. 4; however, the function of the inputs may also be interchanged.

The graph B) in FIG. 7 depicts that the triangular dithering signal is now converted into data Data_out by the ADC 11. The values of Data_out include the triangular form quantized by the ADC 11. The switchable negator circuit 20 is switched according to graph C). Data values corresponding to graph D) occur downstream of the switchable negator circuit 20. In the example depicted, all values are positive, that is to say a positive offset was produced. An oscillation at twice the switching frequency of the switchable negator circuit 20 may also be discerned in the values.

The graphs in FIG. 8 qualitatively depict the shifts of the spectrum on account of the circuit arrangements. The following applies to the circuit arrangements according to FIG. 3 and FIG. 4: a low-frequency (ADC) noise spectrum, which also includes the frequency of zero (e.g., synonymous with a DC offset), is shifted by the switching frequency $f_{neg}$ (graph A)). An (ADC) noise spectrum around the switching frequency $f_{neg}$ is shifted both by $-f_{neg}$ and by $+f_{neg}$ (graph B)). The following especially applies to the circuit arrangement according to FIG. 4: dithering at a frequency $f_{dith}$ close to or equal to the switching frequency $f_{neg}$ is shifted both by $-f_{neg}$ and by $+f_{neg}$ and may therefore produce low-frequency interference and offset harmful to magnetic resonance imaging (graph C)).

The switchable negator circuit 20 according to FIG. 3 includes a negator 21 and a polarity selection switch 22. The non-inverted input signal and the input signal inverted by the inverter 18 are applied to the input of the ADC 11. The inverter 18 multiplies the non-inverted input signal by "−1". A voltage of 1 V, for example, with respect to a reference point is used to form a voltage of −1 V with respect to the reference point.

In this respect, the negator 21 may likewise multiply the data from Data_out by "−1". However, since the binary positive and negative number ranges differ by 1 element, multiplication of the most negative number by "−1" results in a bit overflow that is prevented by additional logic.

As an alternative to multiplying by "−1", the individual bits of Data_out may also be inverted. The result, however, differs from the multiplication by "−1" by "1". However, it is advantageous that a bit overflow may not result in this case.

Multiplication by "−1" is provided below:

$$\ldots \to \ldots$$
$$2 \to -2$$
$$1 \to -1$$
$$0 \to 0$$
$$-1 \to 1$$
$$-2 \to 2$$
$$\ldots \to \ldots$$

Bit-by-bit inversion is provided below:

$$\ldots \to \ldots$$
$$2 \to -3$$
$$1 \to -2$$
$$0 \to -1$$
$$-1 \to 0$$
$$-2 \to 1$$
$$-3 \to 2$$
$$\ldots \to \ldots$$

During bit-by-bit inversion, the result is therefore too negative or too small by the value "1" in comparison with the multiplication by "−1". Assuming that Data_out is zero, the result is likewise zero when multiplied by "−1". In contrast, if Data_out is inverted bit-by-bit, the result is −1. The data values 0/−1/0/−1/ . . . now occur at the switching frequency $f_{neg}$ at the output of the switchable negator circuit 20. This is synonymous with a constant offset of −0.5 LSB and an oscillation amplitude of 1 LSB peak-to-peak at the switching frequency $f_{neg}$.

In practice, both do not play a role. Since the ADC 11 has a very high resolution, a constant offset of −0.5 LSB is insignificant. Furthermore, this would be compensated for anyway during the "tune-up" of a magnetic resonance installation when setting the shim currents (e.g., =direct current that continuously generates a gradient). The peak-to-peak value of the high-frequency oscillation at the switching frequency $f_{neg}$ is greater by the value "1" than during multiplication. Assuming an ADC offset of 10 LSB is compensated for, the amplitude is 21 LSB in comparison with 20 LSB during multiplication. This does not play a role as a result of the high frequency of the switching frequency $f_{neg}$. In this respect, both methods may be used. The examples (e.g., FIG. 6) are marked using "−1" for a multiplication.

A particular method with bit-by-bit inversion results when using "exclusive OR" circuits each having two inputs. The n bits of Data_out are each supplied to an input of the n exclusive OR circuits, and the changeover signal for the negator circuit 20 is present at the other input of each exclusive OR circuit. If the changeover signal is "low", the n bits at the n outputs of the exclusive OR circuits are not inverted; in contrast, if the changeover signal is "high", the n bits are each inverted, and so the negator 21 and the polarity selection switch 22 are implemented at the same time.

Modern ADCs may be controlled in an analog manner with very low losses. SAR-ADCs (SAR=successive approximation register) have an input capacitance of a few tens of picofarads. Gradient pulses that increase from zero to their maximum value in 100 µs, for example, and cause a corresponding current actual value 9 do not produce any high charging currents in the inputs of an ADC 11 connected according to FIG. 2. Small current peaks that occur when the ADC 11 changes over to "sample" again after a conversion would be intercepted using small capacitors at the ADC inputs +IN and −IN. In contrast, if the polarity of the inputs is continuously reversed at a very high frequency using the switching elements 19, quite high input currents may occur.

In the circuits according to FIG. 3 and FIG. 4, the additional small capacitors would advantageously be arranged upstream of the switching elements 19 so that their charge also does not have to be continuously reversed.

Figure 9:
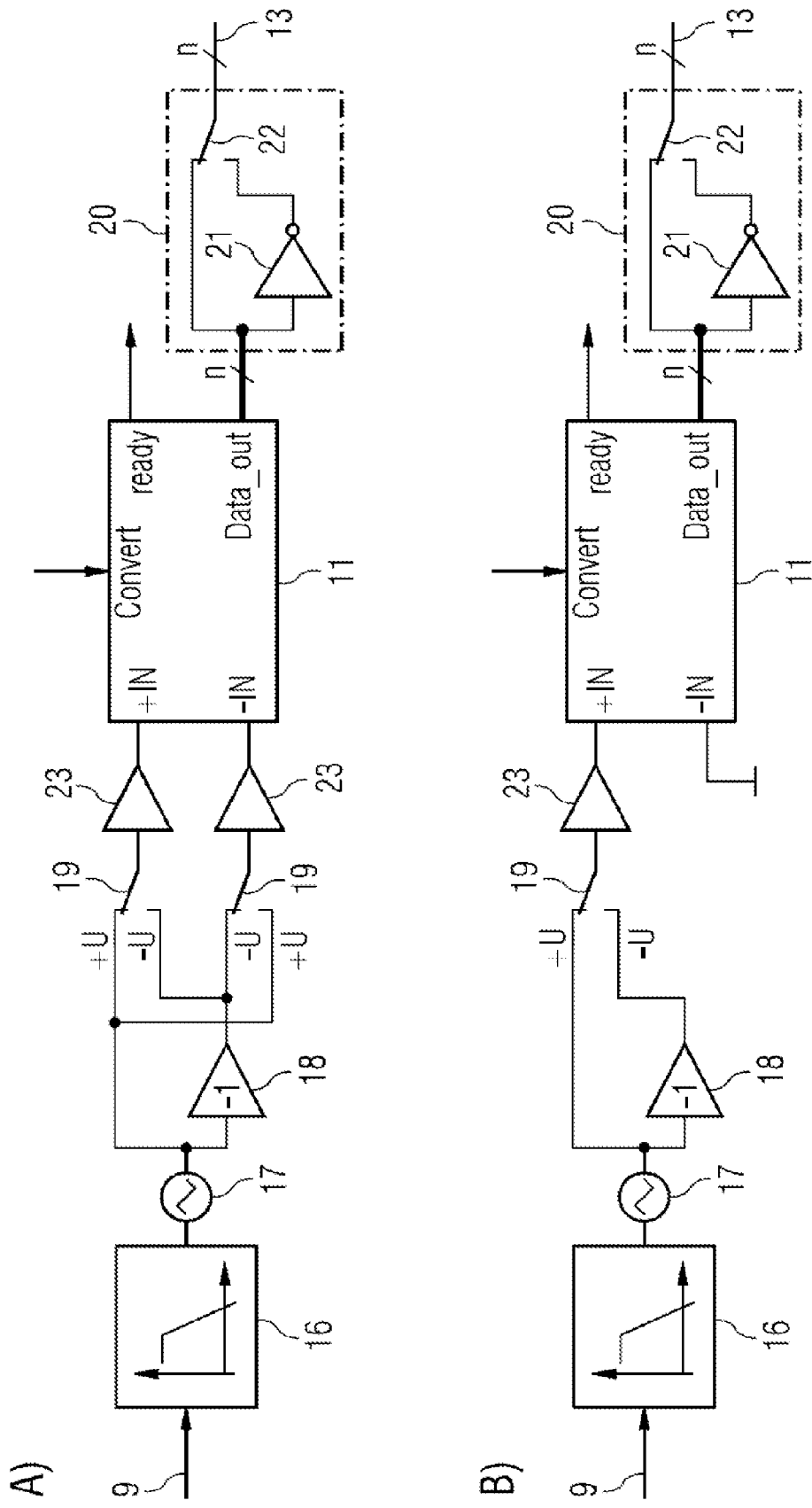
FIG. 9 depicts an embodiment of two block diagrams of the analog actual value preprocessor and of the ADC with suppression of the offset and of the 1/f noise with a voltage follower at the input of the ADC.

FIG. 9 depicts the two block diagrams according to FIG. 3, in which case voltage followers 23 are connected downstream of the switching elements 19. Since the voltage followers 23 are arranged between the switching elements 19 and the switchable negator circuit 20, their offset and their low-frequency noise are also eliminated by the method of operation of the circuit arrangement. The expansion with a voltage follower 23 between the switching elements 19 and the ADC 11 is also possible for the circuit arrangement according to FIG. 4 but is not illustrated here.

Figure 10:
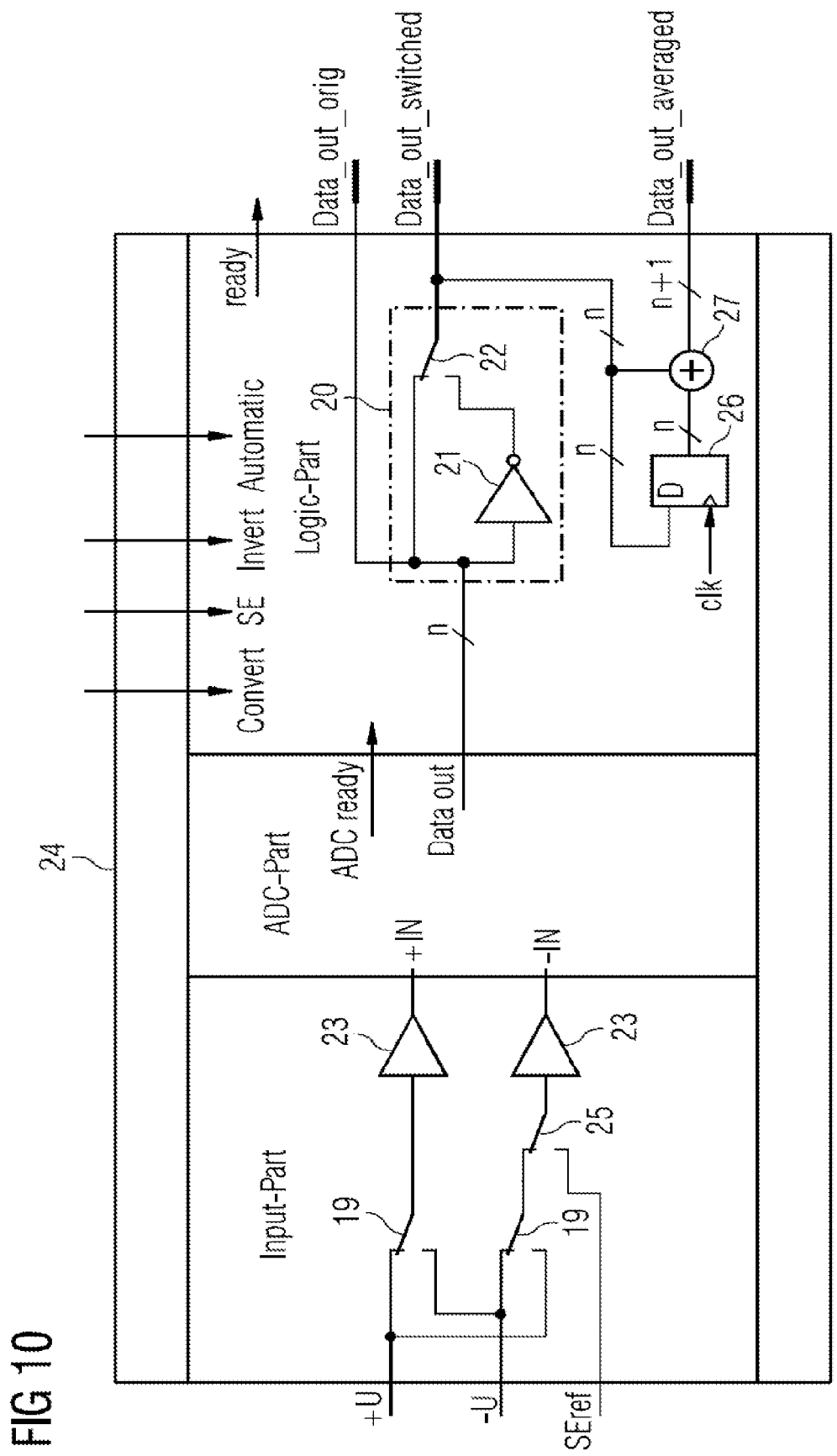
FIG. 10 depicts an embodiment of a block diagram of an ADC.

FIG. 10 depicts an ADC 24 that is suitable for gradient amplifiers and suppresses offset, offset drift, and low-frequency noise. The ADC 24 is divided into an analog input section "Input-part", a "conventional" ADC ("ADC-part"), comparable to the ADC 11 in FIG. 3, and control logic "Logic-part".

The ADC 24 has the analog inputs +U and −U comparable to the corresponding points in the block diagram A) in FIG. 3. The changeover signals SC1 and SC2 from the switching elements 19 are generated by the logic part. The pin SEref (single-ended reference) and the switch 25, which is likewise controlled by the logic part via the changeover signal SC4, are also optionally present. In the position of the switch 25 depicted in FIG. 10, the ADC 24 operates with the differential inputs +U and −U that are alternately applied to the +IN and −IN inputs of the ADC part. If the switch 25 is moved, the "single-ended" ADC operates according to FIG. 4. SEref is now the reference point for the input −IN. In this case, according to FIG. 4, a dithering signal may be fed in, the reference point of which is GND-ref. GND-ref may be a reference voltage or simply "GND" or "ground" if the ADC 24 may operate with bipolar signals taking ground as a reference. The inputs +U and −U are symmetrical with respect to GND-ref. The voltage followers 23 known from FIG. 9 are optionally present.

Like the ADC 11, the ADC part generates the data Data_out and signals the end of the conversion process to the logic part using ADC ready. Inputs of the logic part are the ADC data Data_out, ADC ready, and the signals Convert, SE, Invert and Automatic from the ADC controller that is still present but is not illustrated. Outputs of the logic part to the ADC controller are ready, Data_out_orig, Data_out_switched, and Data_out_averaged. Data_out_orig corresponds to the data Data_out from the ADC part. Data_out_switched are the data at the output of the switchable negator circuit 20.

For use in gradient amplifiers, the data are not necessarily but desirably Data_out_averaged. The additional memory 26 and the adder 27 are present for Data_out_averaged. The last converted data Data_out_switched are held in the memory 26 and are added to the current data from Data_out_switched using the adder 27. If the data at the output of the adder 27 were now divided by two, the average value would result from two successive conversions.

The case in which the switching frequency $f_{neg}$ is at a maximum, that is to say is half as high as the conversion frequency $f_{ADC}$, is particularly interesting. Every second conversion has then been inverted using the switching elements 19 and the switchable negator circuit 20 and an eliminated offset is present in the data from Data_out_switched as ripple at $f_{neg}=\frac{1}{2}*f_{ADC}$. Since averaging is now carried out over every two conversions, this high-frequency ripple is "averaged out".

The average value of two numbers is achieved by adding these numbers and dividing the result by two. However, it is better to dispense with the division and the bit width n of Data_out_averaged may be 1 bit higher than that of Data_out_ switched for this purpose since this provides an additional item of information.

If Data_out_orig, Data_out_switched, and Data_out_averaged are present as parallel data, an additional input may be advantageous in order to keep the number of ADC pins lower, which additional input may be used to determine which of the three possible data records is intended to be output at the outputs of the ADC 24.

As previously, Convert is used to start an analog/digital conversion. SE changes over to single-ended operation. If Invert is set, the logic part changes over the switching elements 19 for the following analog/digital conversions and then changes over the switchable negator circuit 20 at the correct time as long as "Invert" is no longer set. In this case, the logic part itself takes into account whether the ADC part has "pipeline stages".

Assuming that the ADC 24 has a pipeline=2 and Invert is currently set, the next Convert initiates a next analog/digital conversion with switching elements 19 that have been changed over, but the data then appearing next at the output are not from this currently initiated conversion but rather from the previous conversion and therefore is not yet negated by the switchable negator circuit 20.

If "Automatic" is set, the ADC 24 ignores the Invert input and itself switches the switching elements 19 to invert during every second conversion (e.g., $f_{neg}=0.5*f_{ADC}$) and appropriately switches the switchable negator circuit 20 at the correct time.

Internally, the logic part generates a memory signal clk for the memory 26 so that the latter stores the data from Data_out_switched in good time before new data are present at Data_out_switched.

If all data (e.g., Data_out_orig, Data_out_switched, and Data_out_averaged) are stable, the logic part generates the signal "ready" for the ADC controller. Therefore, "ready" comes slightly after "ADC ready", since "ready" also has to take into account the propagation times of the logic in the logic part.

Figure 11:
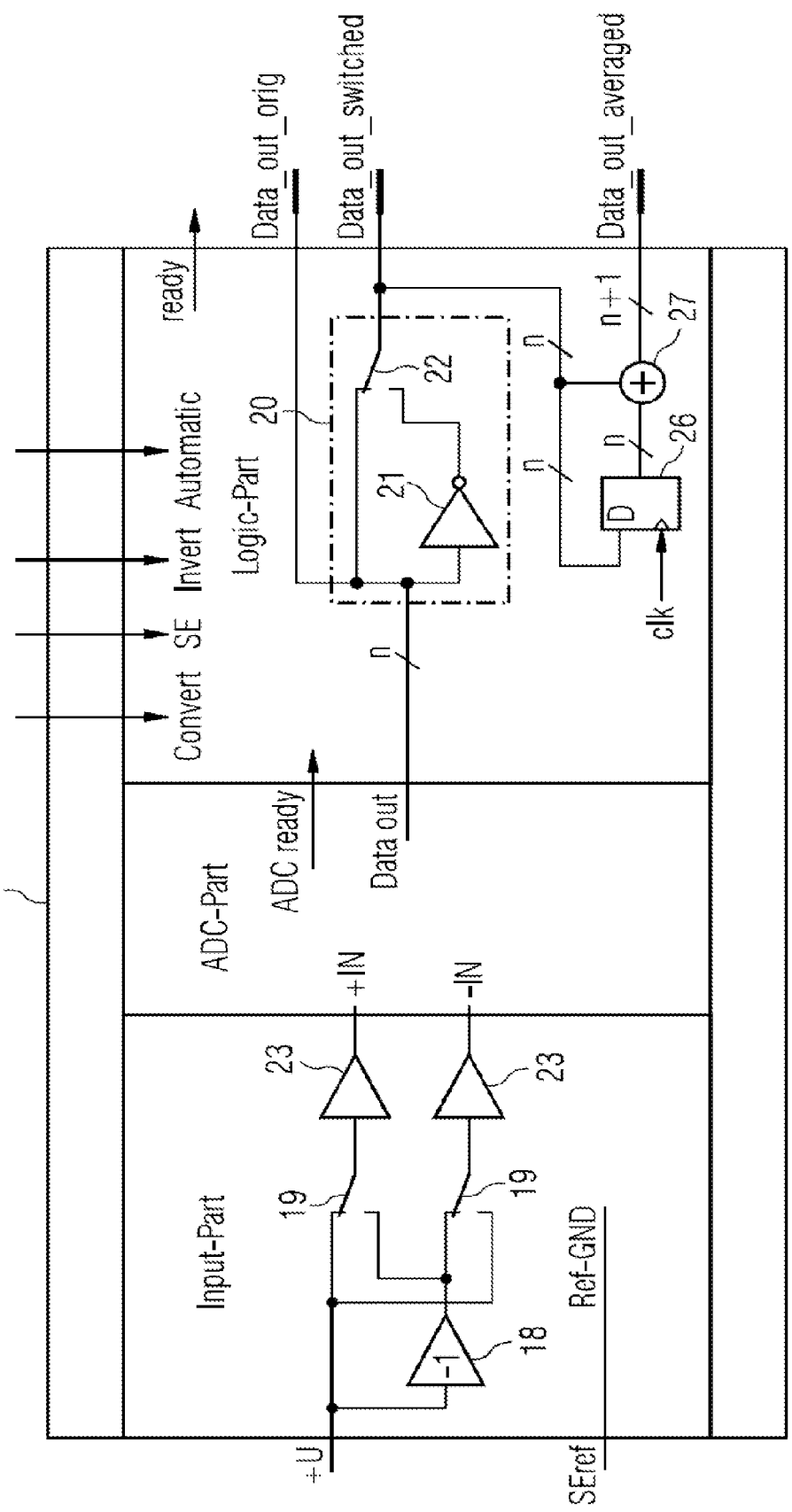
FIG. 11 depicts another embodiment of a block diagram of an ADC.

A block diagram of a variant of the arrangement in FIG. 10 may be seen in FIG. 11, in which case the analog inverter 18 is integrated in the ADC 24. In this case, the ADC 24 has only the analog signal input +U. SEref is the reference point for this signal input. Depending on the design of the ADC 24, the pin SEref may be an input or an output. In the case of an ADC 24 that has a bipolar supply voltage and may also process bipolar signals at +U, SEref lends itself as an "input" and is simply connected to ground—GND—on the external circuit. In this case, the inverter 18 inverts the signal at +U with respect to ground.

In the case of an ADC 24 that may not process a bipolar input voltage, the ADC 24 internally provides the reference point Ref-GND and outputs the reference point at the pin SEref. SEref is an output in this case. +U is therefore a voltage with respect to SEref and the inverter 18 inverts the signal at +U with respect to SEref and Ref-GND.

The frequency of signals at an analog/digital converter may be correctly represented only up to half of the conversion frequency $f_{ADC}$. If a signal frequency exceeds $0.5*f_{ADC}$, its frequency is represented on a reduced scale in the ADC output data. If the signal frequency reaches the conversion frequency $f_{ADC}$, it is represented at the frequency "zero", which is to say as an offset or constant variable. The anti-aliasing filter 16 in the block diagrams in FIG. 3 and FIG. 4 may be a low-pass filter that already has high attenuation at $0.5*f_{ADC}$.

FIG. 12 illustrates signal profiles of an ADC without an anti-aliasing filter, in which case a sinusoidal signal having virtually the frequency of the conversion frequency $f_{ADC}$ is converted. The graphs A) and B) depict the behavior for a circuit arrangement according to FIG. 2; dithering is not visible. The conversion frequency $f_{ADC}$ may be seen in the sequence of the "Convert" pulses. An analog/digital conversion is initiated on the positive edge of Convert and the instantaneous voltage value present in this case is internally held in the ADC in the "hold" state and is plotted as a dashed line.

The graph B) depicts the converted data values matching the voltage value that is held (the conversion time of the ADC is theoretically zero here, that is to say the data are immediately present). The data values no longer have anything to do with the sinusoidal signal in the graph A). If the graph B) were to be continued further to the right, the data values would describe a sine whose frequency is greatly reduced in comparison with the original sine.

The graphs C) to E) in FIG. 12 depict how the circuit arrangement according to FIG. 3 or FIG. 4 would convert the signal. At the inversion points depicted in a perpendicular manner, the switching elements 19 are changed over in good time before "Convert", so that the voltage at the ADC input is changed over (graph C)). On the rising edge of Convert, the ADC accepts the instantaneously present voltage, holds it and converts it into Data_out (graph D)).

The switchable negator circuit 20 generates the data Data_out_switched (graph E)). The data from Data_out that have not been negated are additionally depicted using dashed lines in this graph. The result from Data_out_switched does not differ from the result in the graph B).

It may be concluded from this result, and from the illustration according to FIG. 5, that the choice of the anti-aliasing filter still depends only on the conversion frequency $f_{ADC}$ of the ADC and the lower switching frequency $f_{neg}$ need not be taken into account in this case.

The switching elements 19 and the switchable negator circuit 20 may be constructed, together with the ADC, as an integrated circuit. This may additionally have an automatic mode in which the integrated circuit independently controls inversion and non-inversion.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A circuit arrangement for suppressing offset, offset drift, and 1/f noise during analog/digital conversion, the circuit arrangement comprising:
   an analog/digital converter configured to convert an analog input signal into output data;
   an inverter configured to invert the input signal;
   at least one switching element connected upstream of the analog/digital converter and downstream of the inverter and configured to periodically change over between the input signal and the inverted input signal at a predefinable switching frequency, wherein the predefinable switching frequency is higher than a 1/f noise frequency and less than a conversion frequency of the analog/digital converter; and
   a switchable negator circuit connected downstream of the analog/digital converter and configured to periodically negate the output data from the analog/digital converter at the same predefinable switching frequency, wherein the output data is negated when the inverted input signal is applied to the analog/digital converter,
   wherein the offset, the offset drift, and the 1/f noise are converted into a high-frequency alternating signal without offset and without an imaging effect for a magnetic resonance high-field system.

2. The circuit arrangement as claimed in claim 1, wherein the predefinable switching frequency is at most half as high as the conversion frequency of the analog/digital converter.

3. The circuit arrangement as claimed in claim 2, further comprising:
   an analog/digital control unit configured to control the at least one switching element and the switchable negator circuit.

4. The circuit arrangement as claimed in claim 3, wherein the at least one switching element comprises two switching elements, wherein one switching element is connected upstream of a positive input and the other switching element is connected upstream of a negative input of the analog/digital converter.

5. The circuit arrangement as claimed in claim 4, further comprising:
   a dithering unit connected upstream of the inverter and configured to provide the input signal and the inverted input signal with dithering.

6. The circuit arrangement as claimed in claim 1, further comprising:
   an analog/digital control unit configured to control the at least one switching element and the switchable negator circuit.

7. The circuit arrangement as claimed in claim 1, wherein the at least one switching element comprises two switching elements, wherein one switching element is connected upstream of a positive input and the other switching element is connected upstream of a negative input of the analog/digital converter.

8. The circuit arrangement as claimed in claim 1, wherein the at least one switching element is connected upstream of a positive input of the analog/digital converter; and
   wherein a reference ground is connected to a negative input of the analog/digital converter.

9. The circuit arrangement as claimed in claim 8, further comprising:
   a dithering unit connected upstream of the inverter and configured to provide the input signal and the inverted input signal with dithering.

10. The circuit arrangement as claimed in claim 1, wherein the at least one switching element is connected upstream of a positive input of the analog/digital converter; and
   wherein a dithering unit is connected to a negative input of the analog/digital converter.

11. The circuit arrangement as claimed in claim 1, wherein the switchable negator circuit comprises:
   a negator; and
   a polarity selection switch connected downstream of the negator.

12. The circuit arrangement as claimed in claim 11, wherein the negator is configured to multiply the output data by "−1".

13. The circuit arrangement as claimed in claim 11, wherein the negator is configured to invert bits of the output data.

14. The circuit arrangement as claimed in claim 1, further comprising:
   an anti-aliasing filter arranged at an input of the circuit arrangement and configured to filter the input signal.

15. The circuit arrangement as claimed in claim 1, further comprising:
   a voltage follower connected downstream of the at least one switching element.

16. An analog/digital converter with suppression of offset, offset drift, and 1/f noise during analog/digital conversion, wherein the analog/digital converter is configured to convert an analog input signal into output data,
   wherein an inverter is configured to invert the input signal,
   wherein two switching elements are connected upstream of the analog/digital conversion and downstream of the inverter and are configured to periodically change over between the input signal and the inverted input signal at a predefinable switching frequency, wherein the predefinable switching frequency is higher than a 1/f noise frequency and less than a conversion frequency of the analog/digital converter,
   wherein a switchable negator circuit is connected downstream of the analog/digital conversion and is configured to periodically negate the output data from the analog/digital conversion at the same predefinable switching frequency, wherein the output data is negated when the inverted input signal is applied, and
   wherein the offset, the offset drift, and the 1/f noise are converted into a high-frequency alternating signal without offset and without an imaging effect for a magnetic resonance high-field system.

17. An analog/digital converter with suppression of offset, offset drift, and 1/f noise during analog/digital conversion, wherein the analog/digital converter is configured to convert an analog positive input signal and a negative input signal into output data,
   wherein two switching elements are connected upstream of the analog/digital conversion and are configured to periodically change over between the positive input signal and the negative input signal at a predefinable switching frequency, wherein the predefinable switching frequency is higher than a 1/f noise frequency and less than a conversion frequency of the analog/digital converter,
   wherein a switchable negator circuit is connected downstream of the analog/digital conversion and is configured to periodically negate the output data from the analog/digital conversion at the same predefinable switching frequency, and
   wherein the offset, the offset drift, and the 1/f noise are converted into a high-frequency alternating signal without offset and without an imaging effect for a magnetic resonance high-field system.

18. The analog/digital converter as claimed in claim 17, wherein a voltage follower is connected downstream of the two switching elements.

19. A gradient amplifier comprising:
   a circuit arrangement comprising:
      an analog/digital converter configured to convert an analog input signal into output data;
      an inverter configured to invert the input signal;
      at least one switching element connected upstream of the analog/digital converter and downstream of the inverter and configured to periodically change over between the input signal and the inverted input signal at a predefinable switching frequency, wherein the predefinable switching frequency is higher than a 1/f noise frequency and less than a conversion frequency of the analog/digital converter; and
      a switchable negator circuit connected downstream of the analog/digital converter and configured to periodically negate the output data from the analog/digital converter at the same predefinable switching frequency, wherein the output data is negated when the inverted input signal is applied to the analog/digital converter,
      wherein the offset, the offset drift, and the 1/f noise are converted into a high-frequency alternating signal without offset and without an imaging effect for a magnetic resonance high-field system,
   wherein the input signal is a current actual value of a gradient coil recorded using a measuring resistor.

20. A method for suppressing offset, offset drift, and 1/f noise during analog/digital conversion of an analog input signal to output data, the method comprising:
   inverting the input signal;
   changing over, at least periodically, between the input signal and the inverted input signal at a predefinable switching frequency before the analog/digital conversion and after the inverting, wherein the predefinable switching frequency is higher than a 1/f noise frequency and less than a conversion frequency of the analog/digital converter; and
   periodically negating the output data at the same predefinable switching frequency after the analog/digital conversion, the output data being negated in the case of an inverted input signal,
   wherein the offset, the offset drift, and the 1/f noise are converted into a high-frequency alternating signal without offset and without an imaging effect for a magnetic resonance high-field system.

* * * * *